(12) United States Patent
McQueeney et al.

(10) Patent No.: US 7,009,400 B1
(45) Date of Patent: *Mar. 7, 2006

(54) UNIVERSAL CAPACITIVE ADAPTER FOR ENGINE DIAGNOSTICS

(75) Inventors: Kenneth A. McQueeney, Los Gatos, CA (US); Lee M. Snorteland, San Jose, CA (US)

(73) Assignee: Snap-On Incorporated, Pleasant Prairie, WI (US)

( * ) Notice: Subject to any disclaimer, the term of this patent is extended or adjusted under 35 U.S.C. 154(b) by 21 days.

This patent is subject to a terminal disclaimer.

(21) Appl. No.: 10/772,396

(22) Filed: Feb. 6, 2004

(51) Int. Cl.
*F02P 17/00* (2006.01)
*G01R 27/26* (2006.01)

(52) U.S. Cl. .................... 324/402; 324/380; 324/686

(58) Field of Classification Search ............... 324/402, 324/378–401, 634–636, 686–688; 123/634–636
See application file for complete search history.

(56) References Cited

U.S. PATENT DOCUMENTS

| | | | |
|---|---|---|---|
| 4,758,791 A * | 7/1988 | Tedeschi et al. ............ 324/402 |
| 5,004,984 A * | 4/1991 | Becker et al. ............... 324/402 |
| 5,419,300 A * | 5/1995 | Maruyama et al. ......... 123/634 |
| 5,444,376 A * | 8/1995 | Dittmann et al. ........... 324/402 |
| 5,493,496 A * | 2/1996 | James et al. ................. 701/102 |
| 6,396,277 B1 | 5/2002 | Fong et al. | |
| 6,408,242 B1 * | 6/2002 | Tozzi .......................... 701/114 |

* cited by examiner

*Primary Examiner*—Anjan Deb
*Assistant Examiner*—Jeff Natalini
(74) *Attorney, Agent, or Firm*—McDermott Will & Emery LLP (57) ABSTRACT

A capacitive sensor for an ignition testing apparatus includes a substrate bearing a sensor metallization and a ground metallization, an output lead, a mounting device integrated with the substrate and configured to permit the substrate to be releasably mounted to an ignition coil housing, and a sensor displacement assembly integrated with the substrate and/or the mounting device. The sensor displacement assembly includes at least one member configured to move at least a portion of the sensor metallization in a first direction toward an ignition coil housing and/or a second direction away from an ignition coil housing and/or a third direction lateral to the ignition coil housing while the substrate is mounted on an ignition coil housing using the mounting device.

21 Claims, 9 Drawing Sheets

extension

UNIVERSAL CAPACITIVE ADAPTER FOR ENGINE DIAGNOSTICS

TECHNICAL FIELD

The disclosure relates to engine analyzers for internal combustion engine ignition systems, and particularly coil-on plug or coil-over plug ignition systems. The disclosure has particular applicability to engine analysis in which secondary ignition waveforms and the numerical value of segments of such waveforms are displayed for technician evaluation.

BACKGROUND DISCUSSION

Engine analyzers provide mechanics with a tool for accurately checking the performance of the ignition system as a measure of the overall engine performance. Signal detectors ("test probes") are widely used in diagnosing defects and anomalies in internal combustion engines. A test probe is, for example, placed adjacent to a test point such as a ignition coil or ignition wire, and the test probe communicates the signal back to a motor vehicle diagnostic apparatus. Information obtained from the test probe, such as spark plug firing voltage and duration, can help a mechanic determine if any component in the ignition system is malfunctioning.

Figure 1A:
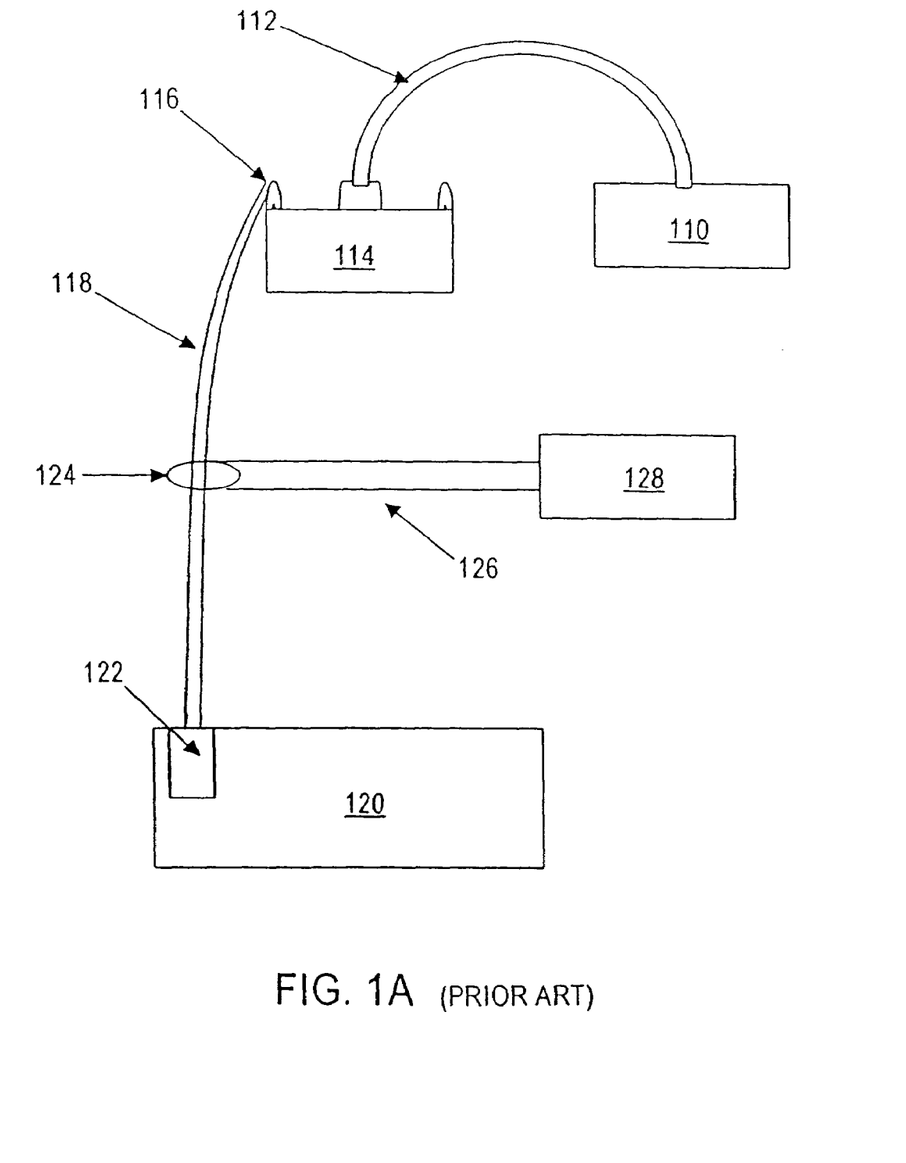
FIGS. 1(a)–(c) depict a conventional capacitive sensor and circuit for detecting secondary ignition voltages of a distributor-based ignition system, a coil-on plug (COP) ignition coil with integrated igniter, and another type of COP capacitive sensor placed adjacent a COP.

FIG. 1a illustrates a capacitive signal detection system. Ignition coil 110 is, essentially, a transformer having a very large turn ratio, typically between 1:50 to 1:100, between the primary and secondary, which transforms the low voltage in a primary winding provided by the sudden opening of the primary current to a high voltage in a secondary winding. Ignition coil 110 is connected to the center or coil terminal (not numbered) of distributor cap 114 by an insulated wire 112. High voltage from the ignition coil 110 is distributed from the coil terminal to side or spark plug terminals of the distributor cap 114 by means of a rotor which distributes the spark to each spark plug terminal at a predetermined timing in a manner known to those skilled in the art and provided in standard technical manuals. The spark voltage provided to the spark plug terminals is, in turn, provided to a corresponding spark plug 122 via insulated wire 118.

At each cylinder, the resulting electric discharge between the spark plug electrodes produces a spark which ignites a fuel-air mixture drawn or forced into the cylinder and compressed to an explosive state, thereby driving a piston in the cylinder to provide power to an attached crankshaft. Analysis of ignition waveforms to evaluate engine performance can be performed by capacitively coupling a capacitive signal pickup 124 to the spark plug wire 118. The capacitive signal pickup 124 is conventionally wrapped around or clipped to wire 118, at one end, and is connected to measuring device 128, at another end, through a wire or coaxial cable 126. The total capacity measured by the pickup 124 is used, in combination with a conventional capacity divider circuit, to determine the wire 118 voltage in a manner known to those skilled in the art.

Figure 1B:
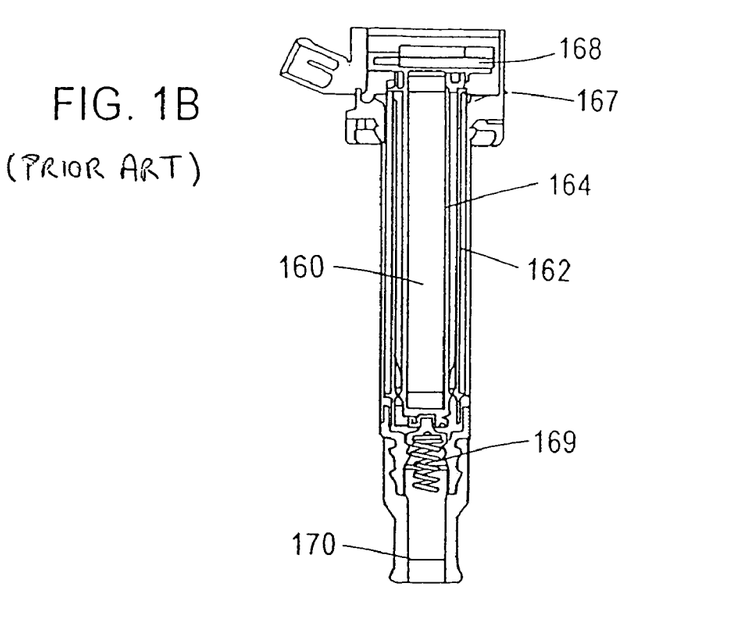

More recently, ignition systems have evolved to one coil per cylinder (conventional coil-on-plug (COP) or one coil per cylinder pair (a direct ignition system (DIS) or double ended coil-on plug (DECOP)). The COP system does not have conventional spark plug wires. These spark ignition systems incorporate an ignition coil over each plug or an ignition coil near each plug as shown, for example, in FIG. 1b. High voltage generated at the secondary coil 164 by means of the primary coil 162 and magnetic iron core 160 is routed through the output of the secondary coil through various conductive elements to a conductive output, such as a spring 169, and to the spark plug (not shown) housed within spark plug cap 170. Igniter 168 is a switch that opens after current has been flowing in the coil. This transient develops a large voltage on the primary which is increased by transformation through secondary coil.

Figure 1C:
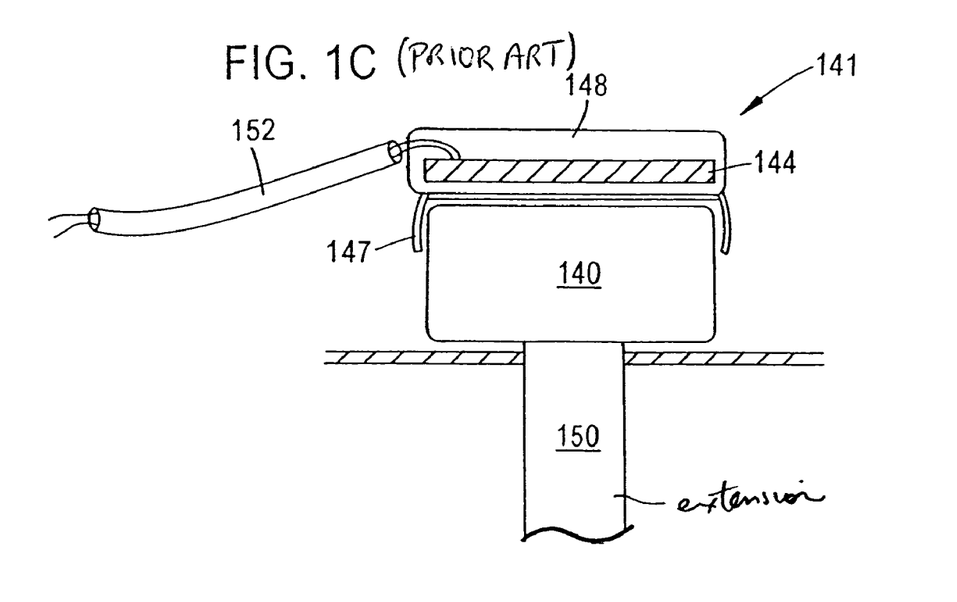

FIG. 1c shows a coil-over-plug (COP) assembly having ignition coil 140 and spark plug cap or extender 150. A spark plug (not shown) is attached to the bottom of the spark plug extender 150. This arrangement prevents application of the conventional technique implemented in FIG. 1a, since the high secondary voltage conductor is not as easily accessed as the wire 118 of FIG. 1a. For this configuration of COP, a coil-on plug signal detector assembly or sensor 141, such as taught by U.S. Pat. No. 6,396,277, issued on May 28, 2002, and assigned to the present assignee, which is incorporated herein by reference, may be used. The COP sensor 141 includes upper and lower conductive layers (not shown) affixed to and separated by substrate 144. The upper and lower conductive layers act, in one aspect, as a signal detector and as a ground plane. The upper layer is conductively coupled to an external signal analyzer device via wire 152 and the ground plane shields a portion of the electric field generated by the coil, attenuating the signal strength to a level usable by conventional analyzers.

The sensor 141 is clipped to the housing of the ignition coil 140 by a clip 147 attached to sensor housing 148. In this arrangement, sensor 141 lies within an electromagnetic field emitted by coil 140 when the coil is transforming primary voltage into high-voltage for use by a spark plug. In operation, low voltage and high current are applied to the primary winding of ignition coil 140 for a predetermined time, and the primary winding generates an electromagnetic field that principally consists of a magnetic field (H). The secondary winding generates an electromagnetic field that is primarily an electric field (E). The lower conductive layer, which is placed adjacent a housing of the coil 140, is brought substantially to ground potential by virtue of such contact. A voltage potential, which could be positive or negative (generally negative for a COP system), is induced or otherwise developed across upper and lower layers 148, and may be measured at or received from the surface of the upper layer or signal detector layer. The voltage observed at the signal detection layer is proportional to the voltage at the terminal end of the secondary coil of coil 140. A signal taken from the signal detection layer may therefore be used in diagnosing ignition spark voltage characteristics, such as spark voltage or burn time, or other problems such as open wires or plugs or fouled or shorted plugs.

However, despite the advancements realized by present coil-on plug signal detection devices, there remains room for improvement, particularly in the fitting of sensors to provide readings for uncommon COP coils and a need exists for a universal adapter configurable to permit readings to be taken from a large number of different COPs.

SUMMARY OF THE DISCLOSURE

In one aspect, there is provided a capacitive sensor for an ignition testing apparatus includes a substrate bearing a sensor metallization and a ground metallization, an output lead, a mounting device integrated with the substrate and configured to permit the substrate to be releasably mounted to an ignition coil housing, and a sensor displacement assembly integrated with the substrate and/or the mounting device. The sensor displacement assembly includes at least one member configured to move at least a portion of the sensor metallization in a first direction toward an ignition coil housing and/or a second direction away from an ignition coil housing, and/or a third direction lateral to an ignition coil housing, while the substrate is mounted on an ignition coil housing using the mounting device.

In another aspect, there is provided a method for diagnostic testing of an ignition coil including the steps of mounting in an initial position on an ignition coil housing a capacitive adapter, described above, connecting the output lead of the capacitive adapter to an engine analyzer, measuring a firing line signal output by the ignition coil using the capacitive adapter, and adjusting a position of the capacitive adapter sensor metallization relative to the ignition coil housing in one of the first direction toward an ignition coil housing and the second direction away from an ignition coil housing to obtain a first measured peak firing line signal between a range of about 5 kV to about 20 kV.

BRIEF DESCRIPTION OF THE DRAWINGS

The foregoing and other features, aspects and advantages of the present concepts are described in the following detailed description which examples are supplemented by the accompanying drawings, in which like reference numerals indicate like elements and in which.

DESCRIPTION OF THE EMBODIMENTS

Coil-on-plug (COP) ignitions generally comprise a spark coil integrally mounted on a spark plug, which protrudes into and is mounted in an engine cylinder and terminates in a spark gap. The spark coil conducts transformed, high voltage direct current to the spark plug using internal connections. The coil receives low voltage direct current via a wiring harness that has a distal end coupled to a primary coil of the coil and a proximal end coupled to a battery.

Figure 2A:
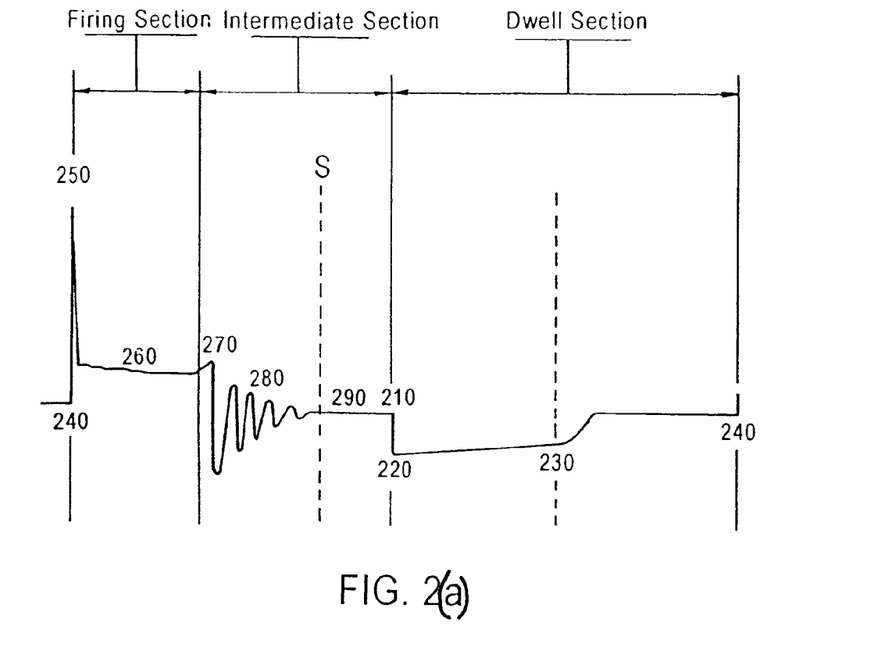
FIGS. 2(a)–(b) respectively depict a typical primary ignition waveform and secondary ignition waveform displayed as a function of time.
Figure 2B:
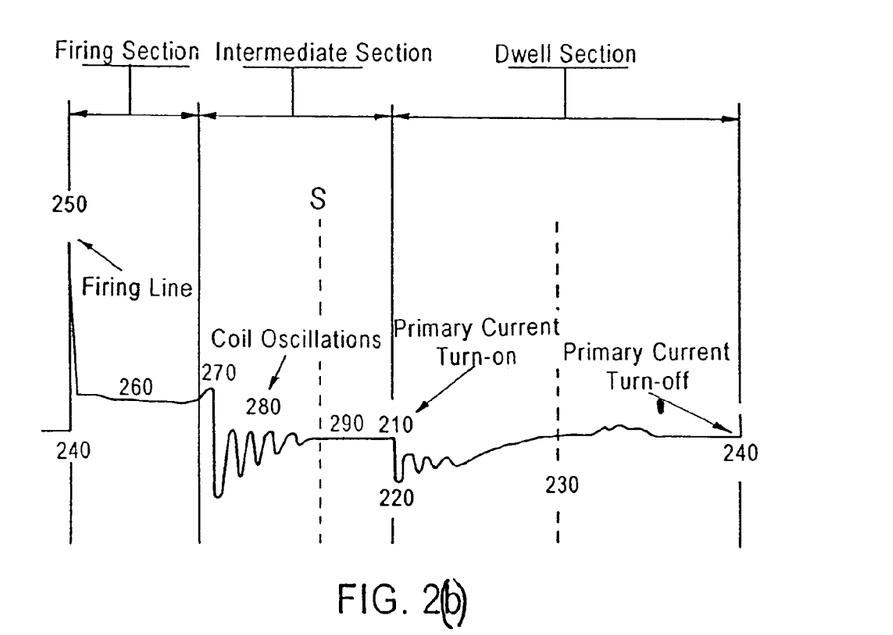

FIGS. 2a and 2b illustrate, respectively, a typical primary ignition waveform and secondary ignition waveform as a function of time. The waveforms have three basic sections labeled Firing Section, Intermediate Section, and Dwell Section.

Common reference numerals are used in FIGS. 2a and 2b to represent common events occurring in both the primary and secondary waveforms. At the start S of the waveform, no current flows in the primary ignition circuit. Battery or charging system voltage available at this point generally ranges from approximately 12–15 volts, but is typically between about 12–14 volts. At 210, the primary switching device turns on the primary current to start the "dwell" or "charge" section. At 220, current flows through the primary circuit, establishing a magnetic field in the ignition coil windings. A rise in voltage occurs along 230 indicating that coil saturation is occurring and, on ignition systems that use coil saturation to control coil current, a current hump or voltage ripple appears at this time. The part of the waveform representing primary circuit on-time is between points 210 and 240. Thus, the portion of the signal between points 210 and 240 represents the dwell period or "on-time" of the ignition coil primary current.

The primary switching device terminates the primary current flow at 240, suddenly causing the magnetic field that had built up to collapse and induce a high voltage in the primary winding by self-induction. An even higher voltage is induced, by mutual induction, into the secondary winding, because of a typical 1:50 to 1:100 primary to secondary turns ratio. The secondary voltage is delivered to the spark plug gap, and the spark plug gap is ionized and current arcs across the electrodes to produce a spark 250 (i.e., the "firing line") to initiate combustion and the spark continues for a period of time called the "spark duration" or "burn time" 260.

The firing line 250, measured in kilovolts, represents the amount of voltage required to start a spark across the spark plug gap, and is generally between about 6–12 kV. The burn time 260 represents the duration of the spark event, is generally between about 1–3 milliseconds and is inversely related to the firing kV. If the firing kV increases, burn time decreases and vice versa. Over the burn time 260, the discharge voltage across the air gap between spark plug electrodes decreases until the coil energy cannot sustain the spark across the electrodes (see e.g., 270). At 280, an oscillating or "ringing" voltage results from the discharge of the coil and continues until, at 290, the coil energy is dissipated and there is no current flow in the primary circuit.

Figure 3A:
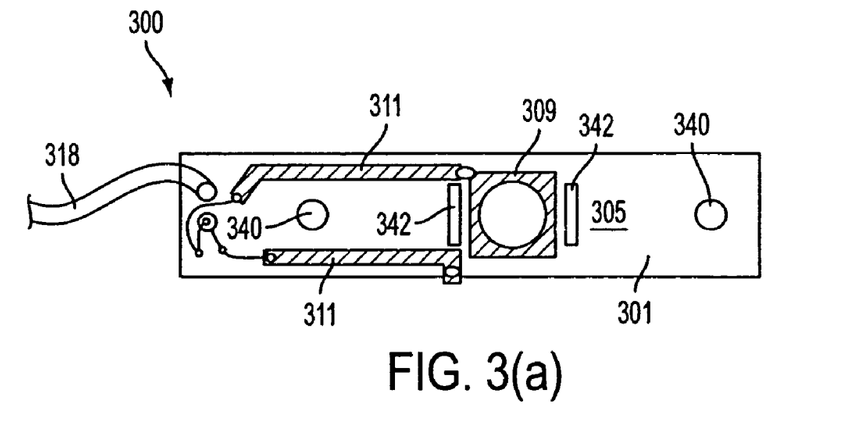
FIGS. 3(a)–(b) respectively are a top view and a bottom view of a capacitive sensor substrate in accord with the present concepts displaying example sensor and ground metallizations, respectively.
Figure 3B:
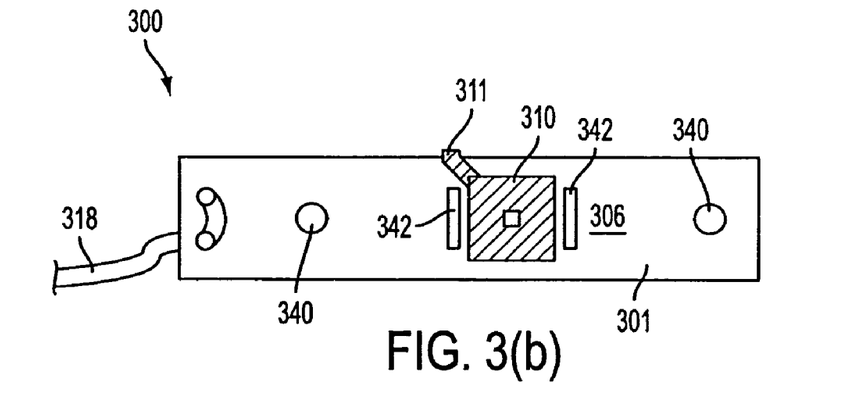
Figure 4A:
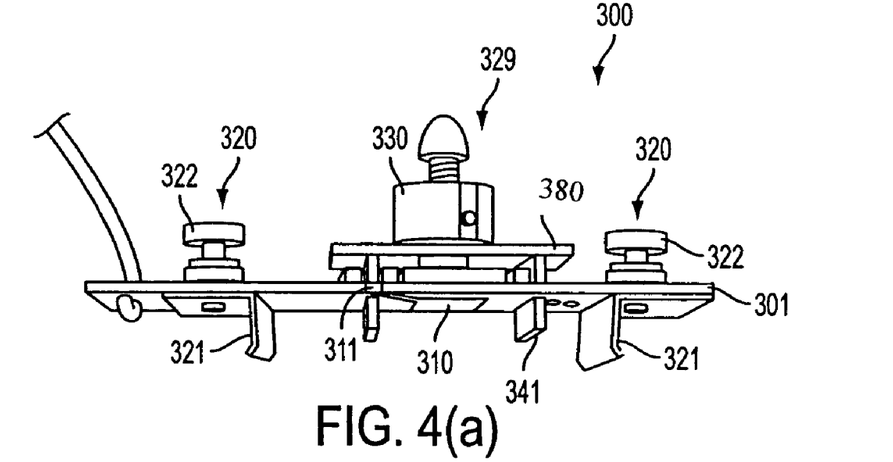
FIGS. 4(a)–(d) are, respectively, an isometric side view of an assembled capacitive sensor in accord with the present concepts in a first extended state, an isometric side view of the capacitive sensor of FIG. 4(a) in a second withdrawn state, an isometric top view of the capacitive sensor of FIG. 4(b), and a top view of the capacitive sensor of FIG. 4(b).
Figure 4B:
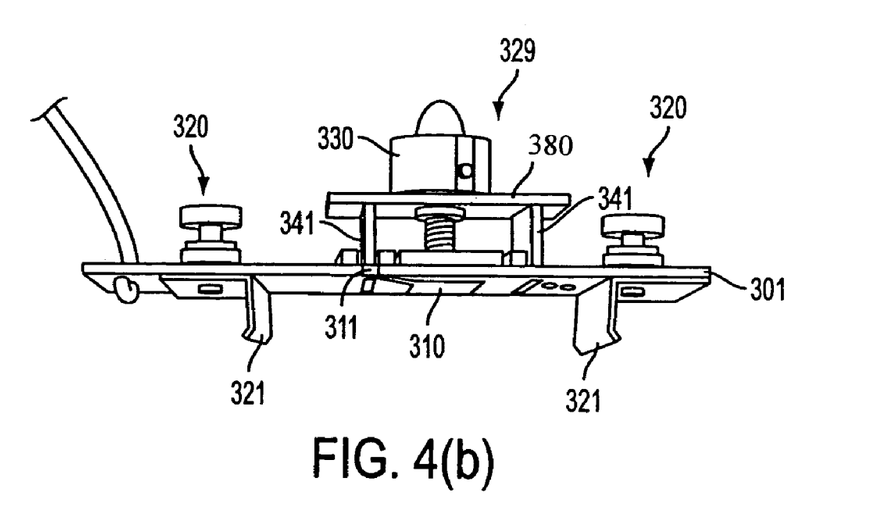
Figure 4C:
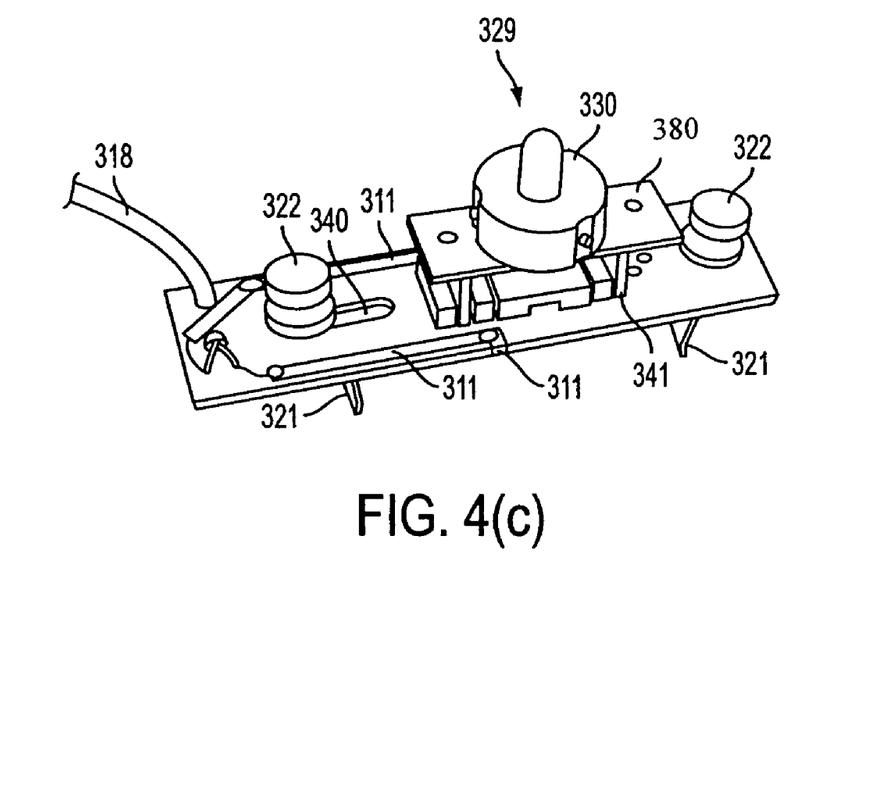
Figure 4D:
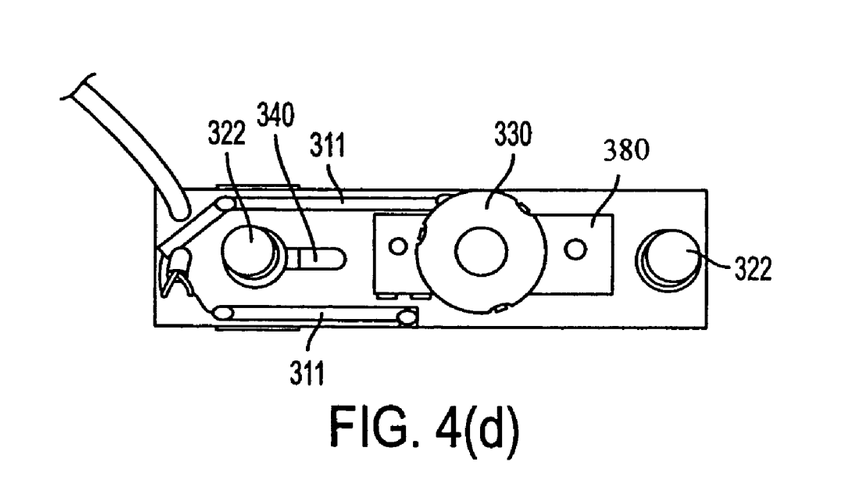
Figure 5:
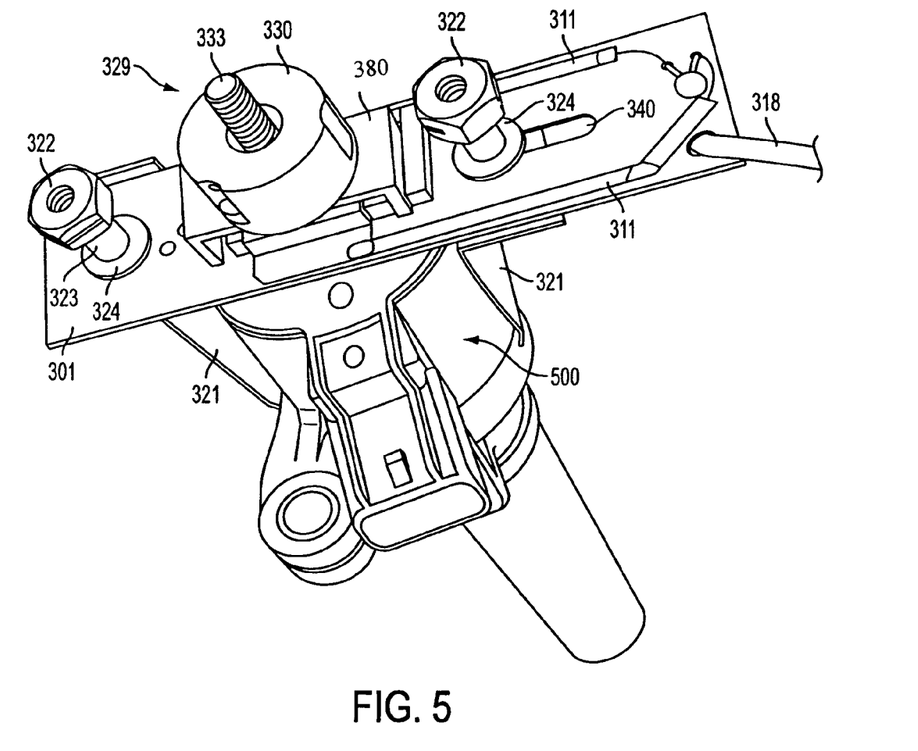
FIG. 5 is an isometric top view of an assembled capacitive sensor in accord with the present concepts attached to an ignition coil housing in a second withdrawn state.

As noted above, there is a need for an adapter for COP systems where conventional sampling adapters are not available, such as for COP coils that are one-of-a-kind, early products, or subject to limited production. An example of an adapter 300 which meets the above need is shown in FIG. 3(a) through FIG. 5. FIGS. 3(a)–(b) show isolated substrate and sensor portions of adapter 300, whereas FIGS. 4(a)–(d) show views of an assembled adapter. FIG. 5 shows adapter 300 mounted on an ignition coil housing (e.g., a coil-on plug housing) 500 for measurement.

As shown in FIGS. 3(a)–(b), adapter 300 generally comprises a substrate 301, a sensor metallization 309 provided on an upper surface portion of substrate 301, and a ground metallization 310 provided on a lower surface portion of substrate 301. Sensor metallization 309 acts as a passive capacitive signal detector for detection of signals and current generated by the secondary coil of the coil-on plug. Cable 318 conducts signals detected by sensor metallization 309 to other equipment, such as a digital signal analyzer (e.g., a Snap-On Vantage KV Module (EETM306A) or Snap-On MODIS™ system).

A protective material or sheath (not shown), such as an epoxy or polymer sealant, may also optionally be provided on one or both metallizations 309, 310 or to the wiring metallizations 311 electrically connected thereto to retard or prevent corrosion or inadvertent grounding of the sensor metallization or associated wiring metallization. As shown in FIGS. 4(a)–(d), an attachment device 320 by which the adapter is secured to a coil-on plug housing (e.g., 500) is also provided, as is a sensor displacement assembly 329 which controls the displacement of the sensor metallization 309 from the coil on plug housing.

FIG. 3(a) is a top view of an example of the adapter 300 comprising a substrate 301, a sensor metallization 309, and a ground metallization 310 configured for use, in combination, on an ignition coil housing (e.g., a coil-on-plug housing). The adapter substrate 301 may comprise a panel of non-conductive material having any substantially planar shape (e.g., square, rectangular, circular, semi-circular, etc.) formed from or comprising any non-conductive material such as, but not limited to, glass-epoxy composite (e.g., FR-4), polymers, ceramics, phenolic, polymides, PTFE, GETEK laminates, plastics, fiberglass, resins, PC board, or combinations or laminates of such materials, or any other generally non-conductive material. In the illustrated example, substrate 301 comprises PC board having a thickness of about 0.0625". The substrate 301 could, however, have a lesser or a greater thickness.

As shown in FIGS. 3(a)–(b), the sensor metallization 309 formed on the upper surface 305 of the substrate serves as a sensor, whereas the ground metallization 310 formed on the lower surface 306 of the substrate 301 acts as the ground. In the illustrated example, the metallization layers 309, 310, as well as the wiring metallizations 311 attached thereto are copper, although any conductive material could be used. The metallizations 309–311 may be adhered or bonded to substrate 301. The connection between the ground wiring metallization 311 on the substrate lower surface 306 may advantageously be connected to the ground wiring metallization 311 on the substrate upper surface 305 by means of a conductive plug or pin formed in a via (not shown) through the substrate.

Although the surface area of the ground metallization 310 is shown in FIGS. 3(a)–(b) to be approximately half that of the sensor metallization 309, this ratio, as well as the shapes of the metallizations 309–311 are completely arbitrary and may be freely varied in size and shape in accord with the present concepts. For example, the surface area of the ground metallization 310 may be selected to afford a desired degree of shielding of the electric field generated by the coil so as to attenuate the strength of the signal passed by the sensor metallization 309. The sensor metallization 309 and/or ground metallization 310 may comprise any appropriate shape, such as a rectangle or square, or may comprise a plurality of separate electrically connected portions, each portion having any of a variety of shapes. For example, the sensor metallization 309 could comprise a meandering or wavelike trace, which could optionally comprise one or more metallization concentrations or nodes. The ground metallization 310 may optionally correspond in shape and/or size to the sensor metallization 309. The ground metallization 310 may also be optionally staggered or laterally displaced from the sensor metallization 309.

Whereas conventional capacitive sensors (e.g., 124) are clipped to the spark plug cables (e.g., 118), as discussed above, capacitive adapter 300 is configured for a positively biased coupling to the housing (e.g., 500) of an ignition coil housing (e.g., a COP housing). This coupling may be achieved by a means for generating a lateral force against an ignition coil housing (e.g., a clip) or by a means for generating a tensile force through members attached to the substrate on one end and hooked, at another end, to selected portions of the ignition coil housing or some other engine component or part of the vehicle engine body. In the aspect represented in the illustrated example, mounting devices 320 are provided at either end of the substrate 301. Each mounting device comprises an engagement member 321 protruding from the bottom of the substrate, and a shaft 323 extending through an opening (e.g., 340) in the substrate. A threaded thumbscrew 322, nut or other conventional device by which a clamping force may be imparted to removably secure the engagement member to the substrate so as to prevent relative rotation or translation therebetween during use of the capacitive adapter 300.

In one aspect, shaft 323 is threaded on the top portion thereof and connects the engagement member 321 top portion to the thumbscrew 322 or nut disposed on the upper side of adapter 300. The openings 340 may be circular to permit rotation of the shaft 323 therein or may be oblong along one or more axes or accurate portions to permit the shaft to both rotate and translate or move laterally within the opening so as to permit adaptation of the adapter 300 to COPs of varied cross-sectional dimensions or configurations. A washer 324, best seen in FIG. 5, may be provided between the thumbscrew 322 and substrate 301 to permit tightening of the thumbscrew and washer against the upper surface 305 of the substrate to prevent rotation and/or translation of the mounting clip relative to the substrate once the adapter 300 has been positioned for a test and to protect the substrate from the forces imparted by the thumbscrew.

The engagement members 321 may be formed of any resilient material capable of imparting and maintaining a lateral force against a COP housing under testing conditions, which may include vibration, as well as torques caused by the weight and placement of the adapter 300, including but not limited to spring steel, various low-carbon steels, engineering plastics (e.g., Ultramid®), or other polymers. Engagement members 321 may comprise, for example, a clamping device or a downwardly projecting member that is substantially planar, substantially planar with an inwardly bent section 325 (as shown), and/or and substantially planar along two axes (e.g., x-axis, y-axis) and concavely curved about at least a portion of a third axis (e.g., z-axis) substantially perpendicular to the two axes. Engagement members 321 may be configured, as illustrated, to individually impart a normal force (single point) or forces (multiple points) to the ignition coil housing. In one aspect, the engagement member 321 may comprise a single resilient clamp, clip, or spring lock, formed from a spring steel or plastic, for example, attached to a lower surface of substrate 301 with engagement members extending downwardly or cross-wise to the substrate.

Engagement members 321 may alternatively be configured by joining distal ends of the engagement members using conventional tensioning members (e.g., ratcheting strap), so as to provide a hoop stress sufficient to retain the adapter 300 in position during testing. It is preferred that such tensioning members, if provided, comprise a visual component which facilitates repeatability of the setting for subsequently tested cylinder ignition coil housings for the vehicle or engine under test. Alternative attachment means, such as magnets (e.g., a Neodymium or Samarium Cobalt magnet), hooks, or clamps attached to distal ends of the engagement members 321 or flexible and/or lengthwise adjustable extensions (e.g., a strap, cord, or rope) attached thereto, may also be employed. In accord with the present concepts of a capacitive adapter 300 having a sensor element 309 positionable at any of a plurality of selected distances from an ignition coil housing, the engagement members 321 may take any shape or form suitable for imparting a force to an ignition coil housing or other engine compartment component sufficient to retain the sensor in place during a test.

Sensor displacement assembly 329 comprises, in the illustrated example, a table 380 configured to translate toward and away from substrate 301 (e.g., up and down). Legs 341 project outwardly from the table 380 and pass through slots 342 provided in the substrate 301 such that a degree of extension of the legs from a bottom of the substrate can be controlled by rotation of the sensor displacement assembly 329 knob 330 clockwise (e.g., toward the substrate) or counterclockwise (e.g., away from the substrate), which causes the threaded knob or nut 330 to translate in the indicated direction along threaded shaft 333. FIGS. 4(a)–4(b) respectively show the table in a fully extended position wherein the legs 341 project from the bottom of the substrate 301 to a maximum degree and a fully withdrawn position wherein the legs do not project from the bottom of the substrate. These positions respectively correspond to a maximum and a minimum displacement of the sensor metallization 309 from the ignition coil housing 500. Accordingly, the sensor 309 can be positioned at a distance from the ignition coil housing 500 which provides a desired degree of electric signal attenuation since the strength of the electric field from the coil falls off with the square of the distance from the coil.

The sensor displacement 329 is not limited to the above example and broadly comprises any assembly integrated with the substrate 301 and/or the mounting device 320 which has at least one member configured to move at least a portion of the sensor metallization 309 toward and/or away from an ignition coil housing in any direction (e.g., vertically (e.g., z-axis), horizontally or laterally (e.g., x-axis, y-axis), or along some angle (e.g., α, δ, θ) thereto) while the substrate is mounted on an ignition coil housing using the mounting device. The angle at which such member is configured to move the sensor metallization 309 (or portion thereof) toward and/or away from an ignition coil housing may include angles such as, but not limited to, about a 45°, 60°, or 90° angle with respect to any of the aforementioned axes, which axes may be defined by reference to any conventional plane such as, but not limited to, the ignition coil housing top surface or side surface. Such member is configured to assume and maintain a position set so that a portion of the member projects beyond the bottom of the substrate by a predetermined amount, which predetermined amount may include zero.

The sensor displacement assembly 329 could comprise, for example, a set screw (not shown) provided to extend through a bottom surface 306 of the substrate 301 over a predetermined range inclusive of zero extension. Such set screw would be disposed to contact an ignition coil housing so as to rotationally bias the substrate 301 away from the ignition coil housing 500 about a hinge point formed by either an attachment device 320 and/or the substrate. For example, attachment device 320 may comprise engagement members 321 or clips extending outwardly from longitudinal surfaces of the substrate 301 (e.g., the top and bottom horizontal lines denoting portions of the substrate circumference in FIG. 3(a)), and a bottom surface 306 of the substrate itself may form a hinge along a line of contact with the ignition coil housing. An attachment device 320 may itself be adapted to permit rotational movement of the substrate relative thereto. A plurality of spaced apart set screws may also optionally be provided.

In yet another configuration, the sensor displacement assembly 329 could be integrated into the attachment device 320. For example, tabs or extension members may be attached to or provided in lateral edges of substrate 301 and the attachment devices 320 may comprise, at upper portions thereof, grooves, slots and/or hollowed cavities slidingly receiving such tabs or extension members. Pins, screws, or other conventional mechanical affixing means may be provided to maintain the tab in a desired configuration relative to the upper portions of the attachment devices 320.

Since the output of the capacitive adapter 300 would be compromised by inadvertent grounding or touching of the sensor to an engine component, for example, exterior surfaces of the capacitive sensor or portions thereof may optionally be coated with a non-conductive material or finish, such as but not limited to rubber or a resin. Thus, a non-conductive coating may be applied, for example, to the whole or part of the wiring metallizations 311, the sensor metallization 309, and/or the ground metallization 310. Such non-conductive coating is not required and may be omitted in favor of added care by the technicians using such device. Metallizations 309–311 may be optionally embedded in whole or in part within substrate 301.

As shown in FIGS. 3(a)–6(b), an output lead 318 is connected to the capacitive adapter 300 and terminates, at a distal end, in a conventional connector, such as a male RCA connector (mRCA) or female RCA connector (fRCA). To optionally enhance the integrity of the connection between the output lead 318 and the substrate 301 and wiring metallizations 311, the output lead may be looped through the substrate or may be otherwise secured to the substrate adjacent the electrical connection between the lead 318 and the lead contact, such as by a wiring clip. The term output lead is intended to generally connote any physical means by which a signal may be output from the capacitive adapter 300 and includes, for example, co-axial cable or wires. Such means for outputting a signal are passive and require no external power, thus complementing the disclosed capacitive adapter by providing a completely passive system advantageously requiring no external power. However, other means for outputting a signal are also encompassed by the present concepts including, but not limited to, acoustic (e.g., radio frequency (RF)) or light-based (e.g., light infrared (IR)) transmitters or any other medium (i.e., carrier waves) by which information may be transmitted.

The aforementioned capacitive adapter 300 may be connected to a Snap-One Vantage/KV Module (EETM306A) with a cable (EETM306A01) and boost plug if needed. "Multi-meter" may be selected from the "Main Menu" and then "Coil On Plug Ign" selected therefrom. Appropriate views and Power KV (Firing Line) may then be selected from the measurement screen. The capacitive adapter 300 may also be connected, for example, to a Snap-On® MODIS™ system. A cable (e.g., 6-03422A, Rev. D) having banana plugs may be used to connect to the MODIS™ Channel 1 and the RCA plug (e.g., mRCA) on the opposite end of the cable provided to mate with the output lead 318 connector (e.g., fRCA). As an arbitrary starting point, a "20 KV" scale may be selected with a "5 ms" full screen sweep or 0.5 ms/div. Under "Channel", the channel number displayed should be selected and the unused traces removed from the screen for clarity.

Once the capacitive adapter 300 is secured in an initial position on an ignition coil housing and the capacitive adapter is connected to an appropriate diagnostic testing device or engine analyzer, such as a Snap-On® Vantage/KV Module, a Snap-On® MODIS™ system, or a conventional lab scope, it is preferred to adjust an output of the capacitive adapter 300 sensor 309 by moving the sensor toward or away from the ignition coil housing until a firing line signal having a magnitude of about 10 kV is obtained. As noted above, the capacitive adapter 300 may be mounted in any orientation relative to the ignition coil housing (e.g., on top of the housing, on a side of the housing, or even on a diagonal to the housing) to obtain a reading. This mounting may be achieved by any conventional attachment means which will permit movement of the sensor metallization 309 toward and/or away from the ignition coil housing including, but not limited to, the disclosed example of a mounting device 320. The mounting is accomplished, in the illustrated example of FIGS. 4(a)–(d), by loosening the threaded thumbscrew 322, positioning the engagement members 321 so as to engage an exterior of an ignition coil housing, such as shown in FIG. 5, and then tightening the thumbscrew.

Figure 6A:
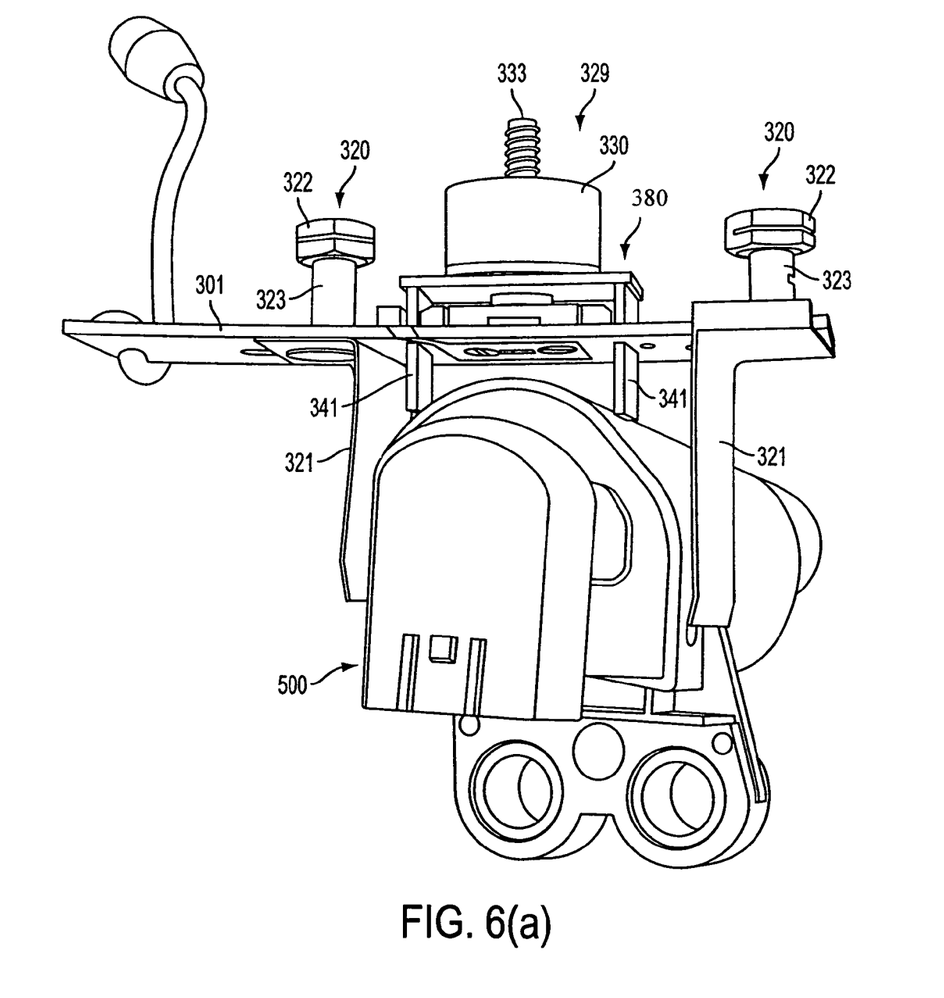
FIGS. 6(a)–6(b) are isometric side views of an assembled capacitive sensor in accord with the present concepts attached, in a first extended state and in a second withdrawn state, respectively, to an ignition coil housing.
Figure 6B:
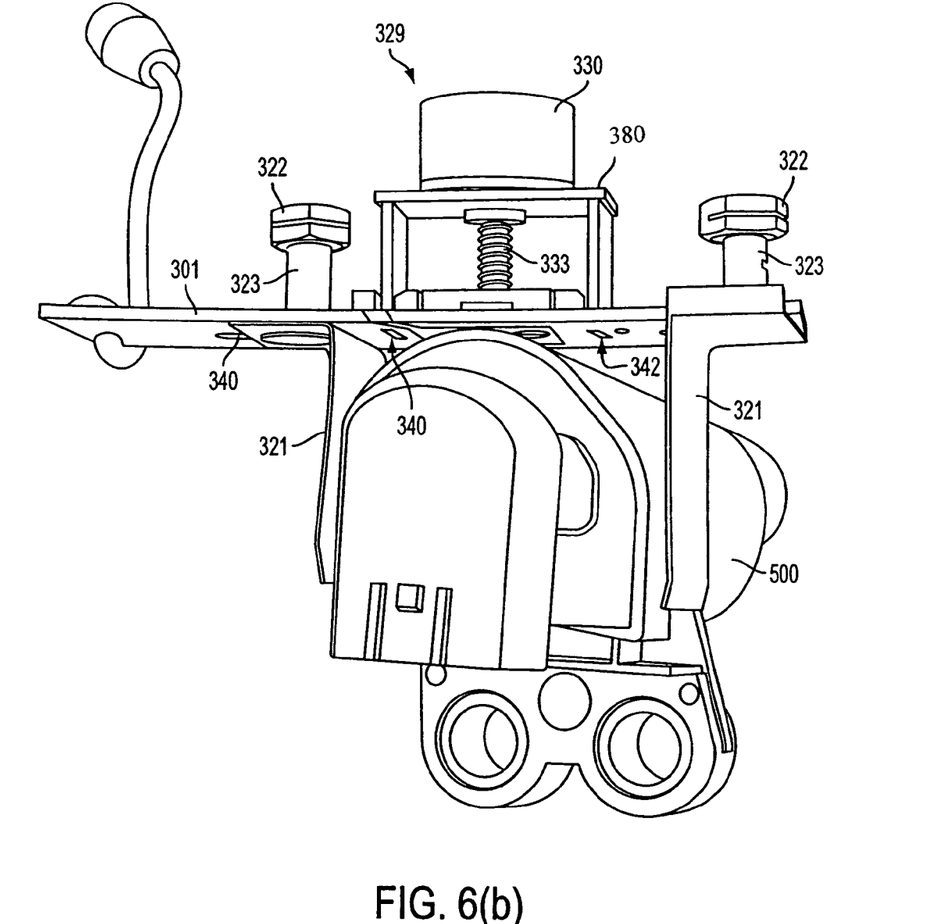

Once positioned on the ignition coil housing, such as shown in FIG. 6(a), with substrate 301 touching the ignition coil housing and sensor metallization 309 in closest proximity thereto, the firing line is measured. If the firing line is greater than about 10 kV, the height of the table 380 may be adjusted by rotation of the knob 330 to increase the distance of the sensor metallization 309 from the ignition coil housing 500, as shown in FIG. 6(b). This firing line value (10 kV) is arbitrary and is selected solely for the reason that this value is typically encountered by technicians and diagnosticians evaluating ignition signal traces and will accordingly mitigate confusion which might arise over other values, such as 5 kV, 20 kV, or 40 kV, which are equally viable in accord with the concepts expressed herein. A firing line of at least 5 kV is desirable.

If a firing line of less than 5 kV, or optionally 10 kV, is not obtained a "boost plug" may be installed at the output cable 318 output connection (e.g., fRCA) to increase the output signal. The boost plug reverses the connection between the center of the coaxial output cable and the ground of the same. Thus, the active side sensor metallization 309 becomes the ground and the ground metallization 310 becomes the active side. Consequently, the sensor metallization (now 310) may be placed adjacent the ignition coil housing without an intervening substrate 301, thereby increasing signal strength. In aspects of the present concepts wherein the means for displacing the sensor from the housing is disposed adjacent the sensor metallization 309 or at distal ends of the substrate 301 and wherein the mounting devices 320 are adaptable or adapted for use with both sides of the substrate, it may also possible to invert the substrate in lieu of using a boost plug to increase the signal strength.

When the capacitive adapter 300 is combined with a Snap-On® MODIS™ system (e.g., with a Lab Scope Module installed and a "Single Cylinder Ignition" selected), the resulting waveform can be viewed for performing ignition diagnostics and the firing line (power kV), spark line (spark kV), and spark duration (burntime) determined. If desired, the Snap-On® Vantage/KV Module can be used to provide a digital display rather than a scope display.

Once an appropriate baseline value has been realized for the first tested cylinder and corresponding ignition coil housing, the capacitive adapter 300 is moved to a position on each of the remaining ignition coil housings that is similar to, if not substantially identical to, the position used to obtain the baseline value. For each ignition coil, the firing line is observed on a screen, stored in a conventional electronic storage medium, and/or printed using a conventional printing means, so as to permit comparison of the ignition coil firing lines to each other. If one coils exhibits a noticeable difference in firing line from the other cylinders, such cylinder may require further attention and/or analysis. Some variance in the firing lines is normal and expected. A problem with a cylinder is generally not indicated unless the difference in firing line between one cylinder and the remaining cylinders is greater than about 10% of the peak firing line (e.g., 1 kV for a 10 kV baseline firing line) and still more definitively, greater than about 20–30% of the peak firing line (e.g., 3 kV for a 10 kV baseline firing line).

The embodiments described herein may be used with any desired ignition system or engine. Those systems or engines may comprises items utilizing organically-derived fuels or fossil fuels and derivatives thereof, such as gasoline, natural gas, propane and the like or combinations thereof. Those systems or engines may be utilized with or incorporated into another systems, such as an automobile, a truck, a boat or ship, a motorcycle, a generator, an airplane and the like. Various aspects of the present concepts have been discussed in the present disclosure for illustrative purposes. It is to be understood that the concepts disclosed herein is capable of use in various other combinations and environments and is capable of changes or modifications within the scope of the concepts expressed herein. Moreover, although examples of the apparatus and method were discussed, the present concepts are not limited by the examples provided herein and additional variants are embraced by the claims appended hereto.

What is claimed:

1. A capacitive sensor for an ignition testing apparatus, comprising:
    a substrate bearing a sensor metallization and a ground metallization;
    a mounting device integrated with the substrate and configured to permit the substrate to be releasably mounted to an ignition coil housing;
    a sensor displacement assembly integrated with at least one of the substrate and the mounting device comprising at least one member configured to move at least a portion of the sensor metallization in at least one of a first direction toward an ignition coil housing, a second direction away from an ignition coil housing, and a third direction lateral to an ignition coil housing, while the substrate is mounted on an ignition coil housing using the mounting device, and
    a signal outputting element.

2. A capacitive sensor for an ignition testing apparatus in accord with claim 1,
    wherein the sensor metallization is formed adjacent a first side of the substrate, and the ground metallization is formed adjacent a second side of the substrate.

3. A capacitive sensor for an ignition testing apparatus in accord with claim 2,
    wherein the sensor displacement assembly comprises a movable first member, disposed at an angle to the substrate, having at least a first end portion adapted to assume and maintain any of a plurality of positions projecting beyond the second side of the substrate.

4. A capacitive sensor for an ignition testing apparatus in accord with claim 3,
    wherein the substrate defines at least one of a threaded-opening and a non-threaded opening through the substrate configured to receive and pass at least the first end portion of the movable first member through the substrate so as to enable the first end portion to project from the second side of the substrate, and
    wherein an exterior geometry of the first end portion of the movable first member corresponds to a respective one of the threaded-opening and a non-threaded opening in the substrate.

5. A capacitive sensor for an ignition testing apparatus in accord with claim 4, wherein the movable first member is substantially perpendicular to the substrate.

6. A capacitive sensor for an ignition testing apparatus in accord with claim 5,
    wherein the substrate comprises at least two spaced apart slots separated from the sensor metallization,
    wherein the sensor displacement assembly comprises a corresponding number of at least two spaced apart first members having a cross-section corresponding in shape and size to that of a respective one of the slots,
wherein the first members are disposed substantially perpendicular to the substrate, and
wherein the first members are joined by a second member disposed substantially parallel to the substrate.

7. A capacitive sensor for an ignition testing apparatus in accord with claim 6, further comprising:
a mounting block disposed on the first side of the substrate,
a first shaft having a proximal end mounted in the mounting block and having a distal threaded end, the threaded end extending through a corresponding threaded hole in the second member, and
a threaded member disposed on the first shaft distal threaded end on a side of the second member opposite to the substrate,
wherein movement of the threaded member along the first shaft distal threaded end in a direction toward the substrate biases the second member toward the substrate, which causes a corresponding movement of the first members.

8. A capacitive sensor for an ignition testing apparatus in accord with claim 5,
wherein the mounting device comprises at least one of a first device configured for generating a lateral force against an ignition coil housing to maintain the substrate in a desired position relative thereto and a second device configured for generating a tensile force in the substrate biasing the substrate toward an ignition coil housing.

9. A capacitive sensor for an ignition testing apparatus in accord with claim 5, wherein the mounting device comprises a clamping device having paired opposing members, of which each of the paired opposing members is at least one of substantially planar, substantially planar with an inwardly bent section, and substantially planar along two axes (e.g., x-axis, y-axis) and concavely curved about at least a portion of a third axis (e.g., z-axis) substantially perpendicular to the two axes.

10. A capacitive sensor for an ignition testing apparatus in accord with claim 9, wherein the paired opposing members are formed from at least one of a steel, plastic, and polymer.

11. A capacitive sensor for an ignition testing apparatus in accord with claim 9, wherein at least one of the paired opposing members is translatable along at least one axis of the substrate.

12. A capacitive sensor for an ignition testing apparatus in accord with claim 11, wherein at least one of the paired opposing members is rotatable.

13. A capacitive sensor for an ignition testing apparatus in accord with claim 1, wherein said signal outputting element is at least one of a cable and wire.

14. A method for diagnostic testing of an ignition coil, comprising the steps of:
mounting in an initial position on an ignition coil housing a capacitive adapter comprising a substrate bearing a sensor metallization and a ground metallization, a mounting device integrated with the substrate and configured to permit the substrate to be releasably mounted to an ignition coil housing, an output lead, and a sensor displacement assembly integrated with at least one of the substrate and the mounting device comprising at least one member configured to move at least a portion of the sensor metallization in at least one of a first direction toward an ignition coil housing, a second direction away from an ignition coil housing, and a third direction lateral to an ignition coil housing, while the substrate is mounted on an ignition coil housing using the mounting device;
connecting the output lead of the capacitive adapter to an engine analyzer;
measuring a firing line signal output by the ignition coil using the capacitive adapter; and
adjusting a position of the capacitive adapter sensor metallization relative to the ignition coil housing in at least one of the first direction, second direction, and third direction to obtain a first measured peak firing line signal within a prescribed range.

15. A method for diagnostic testing of an ignition coil according to claim 14, further comprising the step of:
attaching a boost plug to the output lead if adjustment of a position of the capacitive adapter sensor metallization relative to the ignition coil housing does not yield a first measured peak firing line signal greater than about 5 kV.

16. A method for diagnostic testing of an ignition coil according to claim 15, wherein the adjusting step comprises adjusting a position of the capacitive adapter sensor metallization relative to the ignition coil housing in at least one of the first direction, second direction, and third direction to obtain a first measured peak firing line signal within a range of about 5 kV to about 20 kV.

17. A method for diagnostic testing of an ignition coil according to claim 16, further comprising the steps of:
moving the capacitive adapter to a similar position on each of a plurality of ignition coil housings;
comparing a firing line magnitude of each of the tested ignition coils to determine whether a difference between any two cylinders exceeds about 10% of the first measured peak firing line signal.

18. A method for diagnostic testing of an ignition coil according to claim 17, wherein the comparing step comprises comparing a firing line magnitude of each of the tested ignition coils to determine whether a difference between any two cylinders exceeds about 25% of the first measured peak firing line signal.

19. A method for diagnostic testing of an ignition coil according to claim 14, wherein the adjusting step comprises adjusting a position of the capacitive adapter sensor metallization relative to the ignition coil housing in at least one of the first direction, second direction, and third direction to obtain a first measured peak firing line signal within a range of about 5 kV to about 20 kV.

20. A method for diagnostic testing of an ignition coil according to claim 19, further comprising the steps of:
moving the capacitive adapter to a similar position on each of a plurality of ignition coil housings;
comparing a firing line magnitude of each of the tested ignition coils to determine whether a difference between any two cylinders exceeds about 10% of the first measured peak firing line signal.

21. A method for diagnostic testing of an ignition coil according to claim 20, wherein the comparing step comprises comparing a firing line magnitude of each of the tested ignition coils to determine whether a difference between any two cylinders exceeds about 25% of the first measured peak firing line signal.

* * * * *